United States Patent [19]

Haller

[11] Patent Number: 4,741,964
[45] Date of Patent: May 3, 1988

[54] STRUCTURE CONTAINING HYDROGENATED AMORPHOUS SILICON AND PROCESS

[75] Inventor: Ivan Haller, Chappaqua, N.Y.

[73] Assignee: International Business Machines Corporation, Armonk, N.Y.

[21] Appl. No.: 887,167

[22] Filed: Jul. 17, 1986

[51] Int. Cl.[4] .................. B32B 9/04; H01L 45/00; H01L 29/78

[52] U.S. Cl. .................. 428/446; 428/448; 357/2; 357/23.7

[58] Field of Search .............. 428/446, 448, 688; 357/2, 23.7

[56] References Cited

U.S. PATENT DOCUMENTS

| | | | |
|---|---|---|---|
| 4,285,762 | 8/1981 | Moustakas | 156/643 |
| 4,363,828 | 12/1982 | Brodsky et al. | 427/39 |
| 4,540,647 | 9/1985 | Borsenberger | 427/39 |
| 4,624,737 | 11/1986 | Shimbo | 427/88 X |

FOREIGN PATENT DOCUMENTS 53-45974  4/1978  Japan .
53-72473  6/1978  Japan .
55-146934 11/1980  Japan .

OTHER PUBLICATIONS

H. F. Bare et al., "Etching Patterns in Amorphous Silicon", J. Vac. Sci. Technol. A4 (2), Mar./Apr. 1986, pp. 239–241.

T. L. Chu et al., "Chemical Etching for the Evaluation of Hydrogenated Amorphous Silicon Films", Appl. Phys. Lett. 48(26), 6/30/86, pp. 1783–1784.

Primary Examiner—John E. Kittle
Assistant Examiner—Susan S. Rucker
Attorney, Agent, or Firm—Pollock, Vande Sande & Priddy

[57] ABSTRACT

A structure containing a substrate having a first hydrogenated amorphous silicon layer thereon and a second hydrogenated amorphous silicon layer located above the first layer. The two hydrogenated amorphous silicon layers differ from each other in the concentration of hydrogen contained therein. In addition, a process for fabricating such a structure is provided.

7 Claims, 2 Drawing Sheets

STRUCTURE CONTAINING HYDROGENATED AMORPHOUS SILICON AND PROCESS

DESCRIPTION

1. Technical Field

The present invention is concerned with a structure for providing semiconductor devices and to a process for fabricating such. The present invention is especially applicable to structures that, in turn, are suitable for providing thin-film field effect transistors. The present invention provides a relatively simple and readily reproducible process for obtaining such structures.

2. Background Art

In obtaining semiconductor devices, it is often necessary to obtain a predetermined pattern of thicker and thinner layers of semiconductor material. Such pattern is generally more useful if the semiconductor material is a deposited thin film (as opposed to bulk grown crystal) material, for example, hydrogenated amorphous silicon, or crystalline silicon formed by the high temperature or laser annealing of the amorphous material. One particular application being thin-film field effect transistors.

A typical thin-film field effect transistor includes an electrically conductive gate above an insulating substrate such as glass, a gate insulator such as silicon dioxide above the gate, a hydrogenated amorphous silicon layer above the gate insulator, and electrically conductive source and drain regions above the amorphous silicon. It is desired for such devices to control the current such that when the device is in the "on" state, as high a current as possible exists, but when the device is in the "off" state, the residual current is as small as possible. To achieve such it is desirable to provide doping in the amorphous silicon layer beneath the source and drain regions, but to limit the doping in the amorphous silicon layer in the region between the source and drain regions referred to as the "channel"

Presently, such patterns are fabricated by plasma depositing a layer of uniform thickness hydrogenated amorphous silicon, protecting the desired thicker part of the pattern with a resist image, and etching the unprotected area for a predetermined length of time. However, in order to achieve a well-defined remaining thickness in the etched areas, meticulous control of conditions and of timing is required. Such is relatively expensive and often not practical to implement. Accordingly, these methods are not very well developed and not convenient from a manufacturing or commercial viewpoint.

SUMMARY OF INVENTION

The present invention is concerned with a structure and process capable of providing a patterned multilevel structure that is relatively simple and readily reproducible. In particular, the structure of the present invention includes a substrate (1) that has at least one major surface area. Above the major surface area of the substrate is a first layer (4) of hydrogenated amorphous silicon. The first layer of hydrogenated amorphous silicon contains a first concentration of hydrogen incorporated therein. Located above the first layer of hydrogenated amorphous silicon is a second layer (5) of hydrogenated amorphous silicon. The second layer of hydrogenated amorphous silicon has a second concentration of hydrogen incorporated therein that differs from the concentration of hydrogen incorporated in the first layer.

In addition, the present invention is concerned with a process for fabricating a structure. The process includes providing a substrate (1) having at least one major surface area. Above the major surface area of the substrate is provided a first layer (4) of hydrogenated amorphous silicon. The first layer of hydrogenated amorphous silicon has a first concentration of hydrogen incorporated therein. A second layer (5) of hydrogenated amorphous silicon is provided above the first layer. This second layer has a second concentration of hydrogen incorporated therein that differs from the concentration of hydrogen incorporated in the first layer. A vertically differentiated pattern is provided by selectively etching the layer of hydrogenated amorphous silicon having the higher hydrogen concentration of the first and second layers.

BEST AND VARIOUS MODES FOR CARRYING OUT INVENTION

Figure 1:
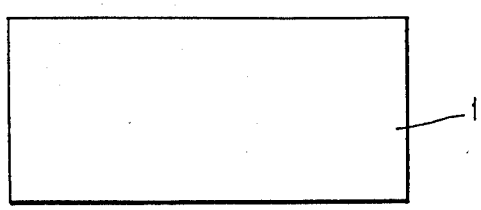
FIGS. 1 to 4 are schematic diagrams showing the structure in various stages of processing in accordance with the present invention.

In FIG. 1 is illustrated a substrate (1).

The substrate (1) includes any suitable substrate material such as glass (e.g., quartz), sapphire, silicon, metal, or metallized substrate.

Figure 2:
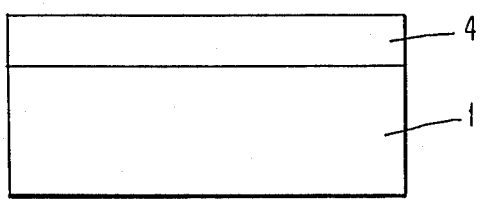

A first layer (4) of hydrogenated amorphous silicon containing a first concentration of hydrogen incorporated therein is deposited (see FIG. 2). In the preferred aspects of the present invention, hydrogenated amorphous silicon layer (4) contains a relatively low concentration of hydrogen as compared to the subsequently to be applied hydrogenated amorphous silicon layer (5). The hydrogenated amorphous silicon layer (4) can be provided by well-known plasma deposition techniques such as placing the structure in a plasma reaction chamber using silane as the source of the hydrogenated amorphous silicon. For the lower concentration of hydrogen, it is preferred to use temperatures of about 225° C. to about 325° C. and most preferably about 275° C. and at a pressure of about 15 millitorr to about 1 torr and most preferably about 230 millitorr. A typical power density is about 5 milliwatts/cm$^2$ of combined surface area of the electrodes exposed to the plasma. The power source is typically operated at a radio frequency of about 13.6 megahertz.

Although the preferred source of the hydrogenated amorphous silicon is 100% silane, such, if desired, can be diluted with an inert gas such as helium, neon, argon, and krypton or diluted with hydrogen. It is known that the presence of hydrogen in the diluent gas will not significantly effect the amount of hydrogen deposited along with the silicon in the hydrogenated amorphous silicon layer.

Moreover, other methods for depositing the hydrogenated amorphous silicon such as those disclosed in U.S. Pat. No. 4,363,828 to Brodsky, et al. can be employed if desired.

Figure 3:
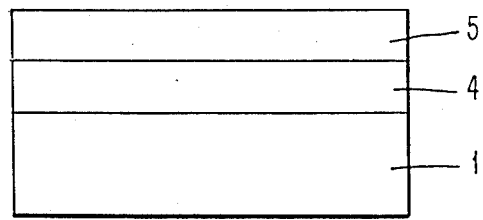

Next, the second layer (5) of hydrogenated amorphous silicon is deposited (see FIG. 3). In the preferred aspects of the present invention the second layer of hydrogenated amorphous silicon (5) contains the greater quantity of hydrogen of the two layers. The increased quantity of incorporated hydrogen can be achieved by the same plasma deposition employed for the first hydrogenated amorphous silicon layer, except by employing a reduced temperature and/or increased pressure. In the preferred aspects of the present invention, the temperature employed for the second hydrogenated amorphous silicon layer is reduced to about room temperature to about 200° C. and preferably about 125° C. while employing the same pressure as used for depositing the first hydrogenated amorphous silicon layer (4).

The thicknesses of the two layers may be chosen at will within the limits of practicality of thin films depositions. Important benefits of the present invention as compared to the prior art will, however, derive when the second layer is thicker or not much thinner than the first layer and when both layers are relatively thin. Thus, typical thicknesses of the first hydrogenated amorphous silicon layer (4) are about 100 to about 50,000 angstroms and preferably about 100 to about 1,000 angstroms.

Typical thicknesses of hydrogenated amorphous silicon layer (5) are about 50 to about 50,000 angstroms and preferably about 100 to about 1,000 angstroms.

The higher concentration of hydrogen in the second hydrogenated amorphous silicon layer results in that layer being more rapidly etched, thereby making it possible to accurately etch down to the interface with first hydrogenated layer (4) allowing for a well-defined remaining thickness as well as a flat surface.

Figure 4:
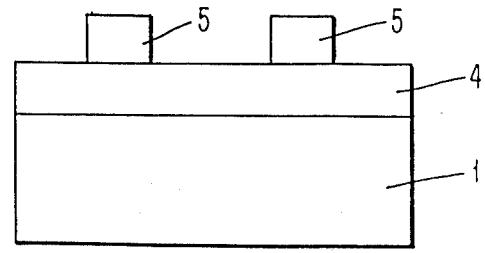

Accordingly, the second hydrogenated amorphous silicon layer (5) can be patterned (see FIG. 4), for instance, by covering the layer (5) with a photoresist material (not shown) exposing the photoresist material to imaging radiation in a predetermined pattern and, thereafter, removing that portion of the photoresist material exposed to the imaging radiation in the case of a positive photoresist material and that material not exposed to radiation in the case of a negative photoresist material as is well-known in the art.

Next, the portion of the second hydrogenated amorphous silicon layer (5) no longer protected by photoresist material is exposed to a suitable etchant in order to develop the desired pattern in the layer (4). Suitable wet chemical etching compositions include strongly alkaline solutions such as alkali metal hydroxide solutions and, in particular, potassium hydroxide and sodium hydroxide. Such compositions preferably are 1 molar or higher. The etching is preferably carried out at normal room temperatures. When more elevated temperatures are employed, the pH of the solution can be somewhat less than that obtained from a 1 molar solution, such as down to about 12.5. Moreover, if desired, other methods of etching can be employed, although not preferred, such as plasma etching or reactive ion etching. The most pronounced effects from the present invention are achieved when employing a wet chemical etching.

In view of the fact that the second layer (5) has the higher hydrogen content and, therefore, etches more rapidly than the first layer, the etching can be carried out such that the etch rate will slow down as the interface to layer (4) is reached, thereby allowing a well-defined remaining thickness and a planar surface.

The level of hydrogen in hydrogenated layers (4) and (5) can now be equilibrated once layer (5) has been patterned by merely raising the temperature of the substrate to that at which the first layer was formed, such as at about 225° C. to about 325° C. and preferably at about 275° C. and maintain the substrate there for a sufficient amount of time in order to lower the hydrogen content in the second layer. This usually takes about 1 to about 30 minutes.

Reference to FIGS. 5 to 8 illustrates the application of the present invention in fabricating thin film effect transistors.

Figure 5:
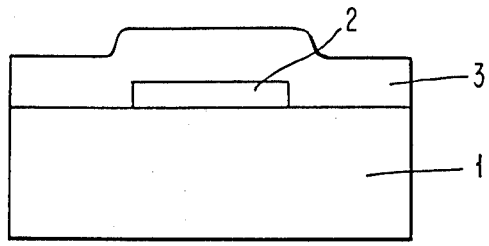
FIGS. 5 to 8 illustrate the application of the invention in fabricating thin film field effect transistors.

In FIG. 5 is illustrated a substrate (1) containing an electrically conductive gate (2) thereon and a gate insulator (3).

The substrate (1) includes any suitable substrate material such as glass (e.g., quartz), sapphire, silicon, metal, or metallized substrate.

The gate (2) is of a metallic-type high electrical conductivity material, preferably a metal such as chromium, nickel, molybdenum, and aluminum, as well as non-metallic materials such as highly doped polycrystalline silicon or intermetallic silicides which, nevertheless, have electrical conductivities of the magnitude generally possessed by metals. The gate (2) is defined by well-known photolithographical techniques that need not be discussed herein in any detail.

Located above the electrically conductive gate (2) is a gate insulator (3) such as silicon dioxide and silicon nitride.

Figure 6:
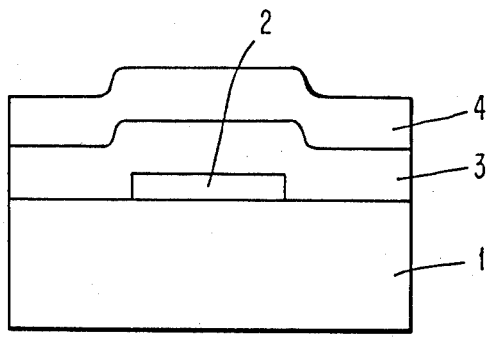
Figure 7:
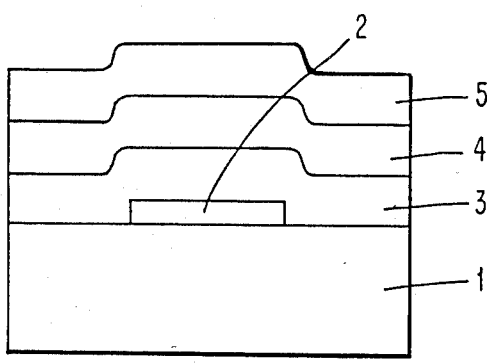
Figure 8:
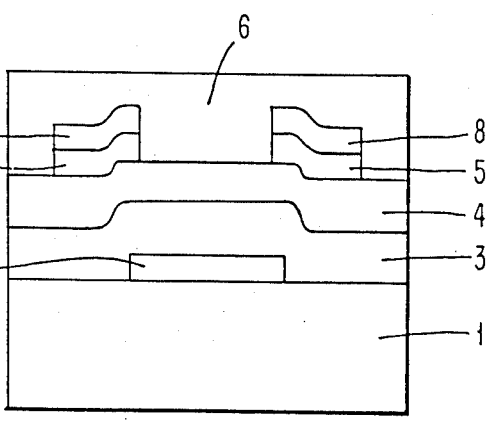

A first layer (4) of hydrogenated amorphous silicon containing a first concentration of hydrogen incorporated therein is deposited (see FIG. 6). In the preferred aspects of the present invention, hydrogenated amorphous silicon layer (4) contains a relatively low concentration of hydrogen as compared to the subsequently to be applied hydrogenated amorphous silicon layer (5). The hydrogenated amorphous silicon layer (4) can be provided by well-known plasma deposition techniques such as placing the structure in a plasma reaction chamber using silane as the source of the hydrogenated amorphous silicon. For the lower concentration of hydrogen, it is preferred to use temperatures of about 225° C. to about 325° C. and most preferably about 275° C. and at a pressure of about 15 millitorr to about 1 torr and most preferably about 230 millitorr. A typical power density is about 5 milliwatts/cm$^2$ of combined surface area of the electrodes exposed to the plasma. The power source is typically operated at a radio frequency of about 13.6 megahertz.

Although the preferred source of the hydrogenated amorphous silicon is 100% silane, such, if desired, can be diluted with an inert gas such as helium, neon, argon, and krypton or diluted with hydrogen. It is known that the presence of hydrogen in the diluent gas will not significantly effect the amount of hydrogen deposited along with the silicon in the hydrogenated amorphous silicon layer.

Moreover, other methods for depositing the hydrogenated amorphous silicon such as those disclosed in U.S. Pat. No. 4,363,828 to Brodsky, et al. can be employed if desired.

Next, the second layer (5) of hydrogenated amorphous silicon is deposited (see FIG. 3). In the preferred aspects of the present invention the second layer of hydrogenated amorphous silicon (5) contains the greater quantity of hydrogen of the two layers. The increased quantity of incorporated hydrogen can be achieved by the same plasma deposition employed for the first hydrogenated amorphous silicon layer, except by employing a reduced temperature and/or increased pressure. In the preferred aspects of the present invention, the temperature employed for the second hydrogenated amorphous silicon layer is reduced to about room temperature to about 200° C. and preferably about 125°

C. while employing the same pressure as used for depositing the first hydrogenated amorphous silicon layer (4).

As discussed above, the thickness of the two layers may be chosen at will within the limits of practicality of thin films depositions. Important benefits of the present invention as compared to the prior art will, however, derive when the second layer is thicker or not much thinner than the first layer and when both layers are relatively thin. Thus, typical thicknesses of the first hydrogenated amorphous silicon layer (4) are about 100 to about 50,000 angstroms and preferably about 100 to about 1,000 angstroms.

Typical thicknesses of hydrogenated amorphous silicon layer (5) are about 50 to about 50,000 angstroms and preferably about 100 to about 1,000 angstroms.

In addition, for the preferred aspects of the present invention, when the present invention is to be used to provide a thin-film field effect transistor, the second hydrogenated amorphous silicon layer is also doped in order to increase its conductivity. A suitable n-type dopant is phosphorous and a suitable p-type dopant is boron. The phosphorous can be incorporated, for instance, by including in the plasma gas, phosphine ($PH_3$), such as in amounts of a few ppm to about 1% by volume of the gaseous mixture employed. The boron can be provided by using a gaseous boron-containing compound such as diborane ($B_2H_6$).

The higher concentration of hydrogen in the second hydrogenated amorphous silicon layer results in that layer being more rapidly etched, thereby making it possible to accurately etch down to the interface with first hydrogenated layer (4) allowing for a well-defined remaining thickness as well as a flat surface.

Accordingly, the second hydrogenated amorphous silicon layer (5) can be patterned (see FIG. 4), for instance, by covering the layer (5) with a photoresist material (not shown) exposing the photoresist material to imaging radiation in a predetermined pattern and, thereafter, removing that portion of the photoresist material exposed to the imaging radiation in the case of a positive photoresist material and that material not exposed to radiation in the case of a negative photoresist material as is well-known in the art.

Next, the portion of the second hydrogenated amorphous silicon layer (5) no longer protected by photoresist material is exposed to a suitable etchant in order to develop the desired pattern in the layer (4). Suitable wet chemical etching compositions include strongly alkaline solutions such as alkali metal hydroxide solutions and, in particular, potassium hydroxide and sodium hydroxide. Such compositions preferably are 1 molar or higher. The etching is preferably carried out at normal room temperatures. When more elevated temperatures are employed, the pH of the solution can be somewhat less than that obtained from a 1 molar solution, such as down to about 12.5. Moreover, if desired, other methods of etching can be employed, although not preferred, such as plasma etching or reactive ion etching. The most pronounced effects from the present invention are achieved when employing a wet chemical etching.

In view of the fact that the second layer (5) has the higher hydrogen content and, therefore, etches more rapidly than the first layer, the etching can be carried out such that the etch rate will slow down as the interface to layer (4) is reached, thereby allowing a well-defined remaining thickness and a planar surface.

That portion of layer (5) that remains is patterned so as to be beneath source and drain regions to be subsequently provided, while that portion of layer (5) removed corresponds to the area between the source and drain regions to be provided, referred to as the "channel". Accordingly, by proper doping of layer (5), increased conductivity beneath the source and drain regions can be obtained without concomitantly increasing the conductivity between the source and drain regions when the device is in the "off" state. This, in turn, allows for improved ohmic contact. In other words, increased ohmic contact is provided by the doping between the hydrogenated amorphous silicon and the source and drain regions, but the highly doped amorphous layer is cleanly removed from the channel region between the source and drain regions. Source and drain regions (7) and (8) are provided by well-known techniques, for example, by depositing a blanket metallization (not shown) prior to application of the photoresist on top of layer (5) and patterning it with the mask as used for patterning layer (5).

The level of hydrogen in hydrogenated layers (4) and (5) can be equilibrated once layer (5) has been patterned by merely raising the temperature of the substrate to that at which the first layer was formed, such as at about 225° C. to about 325° C. and preferably at about 275° C. and maintain the substrate there for a sufficient amount of time in order to lower the hydrogen content in the second layer. This usually takes about 1 to about 30 minutes.

Depending on application, the etched region can be covered with a passivation or encapsulation layer (6).

Although the present invention has been described with respect to only two different layers of hydrogenated amorphous silicon, it is understood that the present invention can be carried out with three or more different layers or thicknesses of hydrogenated amorphous silicon, each having a different concentration of hydrogen as compared to the layer juxtaposed it.

In order to demonstrate the significant variation in the etching rate of different hydrogenated amorphous silicon layers, the following examples are presented.

EXAMPLE 1

A number of samples are prepared whereby hydrogenated amorphous silicon is deposited using the same apparatus and conditions, except for the substrate temperature and the presence or absence of dopant gas. No significant variation in the deposition rate of the hydrogenated amorphous silicon layer is observed. The substrate employed is glass, the pressure of the plasma deposition is about 230 millitorr, the power density is about 5 milliwatts/$cm^2$ of combined surface area of the electrodes exposed to the plasma, and the power is radio frequency of about 13.6 megahertz. The dopant gas, when employed, is phosphine. The hydrogen content and distribution of the samples are obtained from infrared spectra. For etch rate measurements, the samples are protected with groove-pattern wax and are held in a jig that allows simultaneous immersion into the etchant of all of the samples. The etchant is a continuously stirred 1 molar solution of potassium hydroxide at 23° C. The depth of grooves etched into the hydrogenated amorphous silicon in three different etch times is measured with a "Tencor Alphastep" instrument. The results obtained are presented hereinbelow in Table I.

As apparent from Table I, the lowering of the substrate temperature results in a significant increase of the total hydrogen content, of the relative intensity of the hydrogen bending modes (a measure of the fraction of hydrogen in other than monohydride form), and of the etch rate. Moreover, the addition of the dopant, even without a temperature change, has a similar, although much smaller, effect.

EXAMPLE 2

A set of samples, similar to those in Example 1, are prepared. The samples are etched in a dry etching apparatus, in the plasma etching mode, at various power levels, at a pressure of 30 mtorr, in an 80:20 mixture of carbon tetrafluoride and oxygen. High hydrogen content samples are found to etch at rates approximately 60 percent higher than corresponding identically doped samples with low hydrogen content.

TABLE I

| | Composition and Etch Properties of Various a-Si:H Samples | | | |
|---|---|---|---|---|
| Growth Temperature (°C.) | Dopant Concentration (gas-phase, % phosphine) | Incorporated Hydrogen ($10^{22}$ cm$^{-3}$) | Bending Mode Ratio | Etch Rate (angstrom/min) |
| 275 | 0.0 | 1.00 | <0.05 | 174 |
| 275 | 1.0 | 1.36 | 0.10 | 202 |
| 125 | 0.0 | 1.70 | 0.18 | 275 |
| 125 | 1.0 | 2.17 | 0.6 | 548 |

Having thus described my invention, what I claim as new and desire to secure by Letters Patent is:

1. A structure comprising:
    a substrate suitable for use in semiconductor devices having at least one major surface area;
    a first layer of hydrogenated amorphous silicon adjacent said major surface area wherein said first layer has a first concentration of hydrogen incorporated therein;
    a second layer of hydrogenated amorphous silicon adjacent said first layer and having a second concentration of hydrogen incorporated therein that differs from said first concentration and wherein the layer having the higher hydrogen concentration is patterned and the layer having the lower concentration is not patterned.

2. The structure of claim 1 wherein said second layer has a higher hydrogen concentration than said first layer.

3. The structure of claim 20 wherein the layer having the higher hydrogen concentration is doped.

4. The structure of claim 1 wherein said substrate is selected from the group of glass, sapphire, silicon, metal, and metallized substrates.

5. The structure of claim 2 wherein said second layer is thicker than said first layer.

6. The structure of claim 5 wherein the thickness of said first layer is about 100 to about 1000 angstroms and the thickness of said second layer is about 100 to about 1000 angstroms.

7. The structure of claim 1, wherein said second layer is thicker than said first layer.

* * * * *